US 6,744,657 B2

(12) United States Patent
Agata

(10) Patent No.: US 6,744,657 B2
(45) Date of Patent: Jun. 1, 2004

(54) READ ONLY DATA BUS AND WRITE ONLY DATA BUS FORMING IN DIFFERENT LAYER METALS

(75) Inventor: Masashi Agata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 85 days.

(21) Appl. No.: 10/245,012

(22) Filed: Sep. 16, 2002

(65) Prior Publication Data

US 2003/0053360 A1 Mar. 20, 2003

(30) Foreign Application Priority Data

Sep. 14, 2001 (JP) ........................................ 2001-280253

(51) Int. Cl.[7] ................................................ G11C 5/06
(52) U.S. Cl. .......................................... 365/63; 365/149
(58) Field of Search ..................................... 365/63, 149

(56) References Cited

U.S. PATENT DOCUMENTS 5,581,126 A  12/1996 Moench
5,691,949 A * 11/1997 Hively et al. .......... 365/230.03
6,081,005 A   6/2000 Fuchigami et al.
6,418,067 B1 * 7/2002 Watanabe et al. ........... 365/200

* cited by examiner

*Primary Examiner*—Hoai Ho
(74) *Attorney, Agent, or Firm*—Akin, Gump, Strauss, Hauer & Feld, L.L.P.

(57) ABSTRACT

A semiconductor memory device that enables data buses to operate at high speed by reducing wiring capacitance and interference noise between data bus lines is provided. A semiconductor memory device includes a read-only data bus which is formed in a first metal layer and has plural pairs of read lines precharged to an arbitrary voltage and two lines in a pair transmitting complementary read signals. A write-only data bus, which is positioned in parallel with the read-only data bus, is formed in a second metal layer different from the first metal layer and has plural pairs of write lines precharged to an arbitrary voltage, and two lines in a pair transmitting complementary write signals.

11 Claims, 15 Drawing Sheets

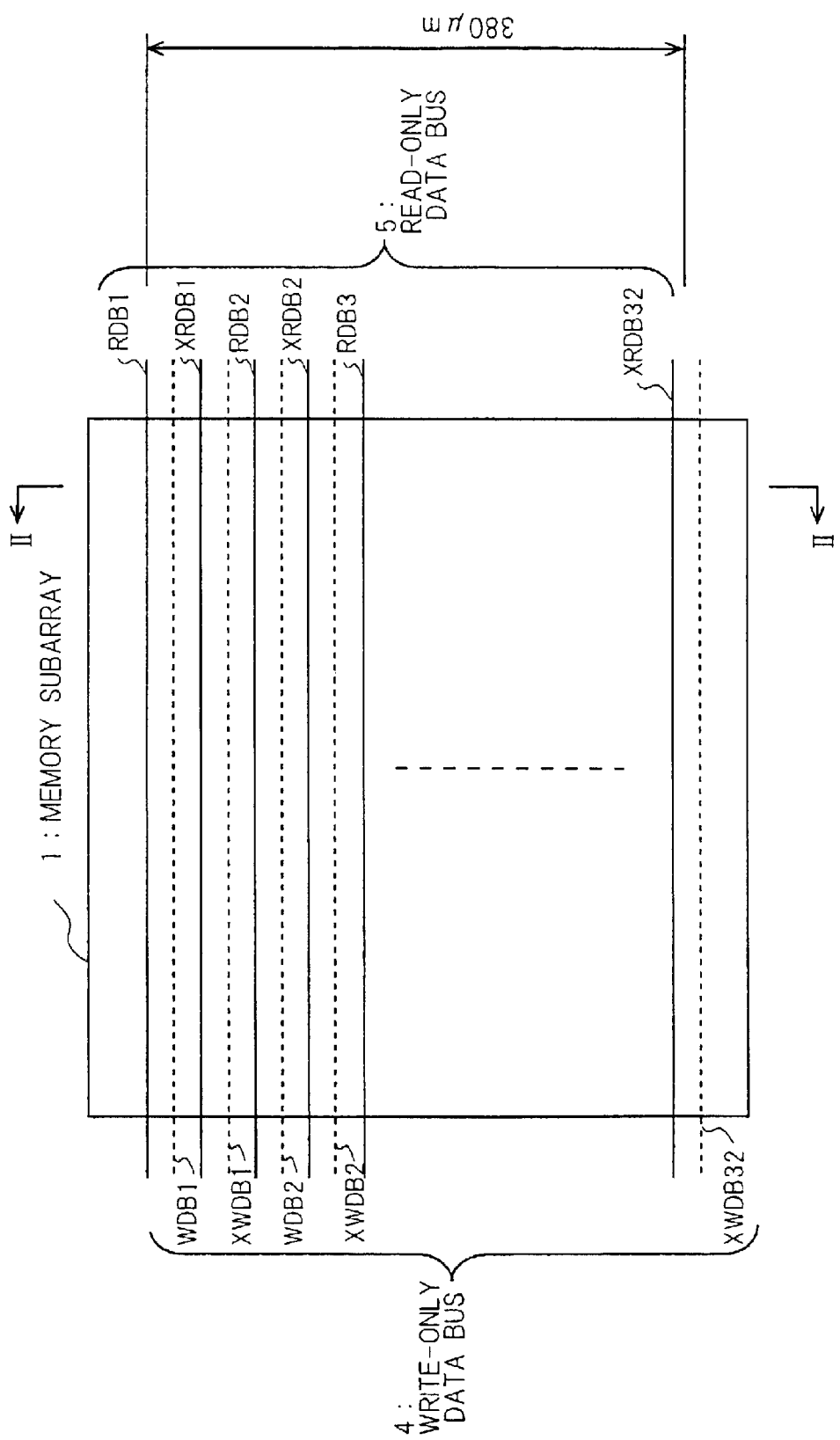
F I G. 4

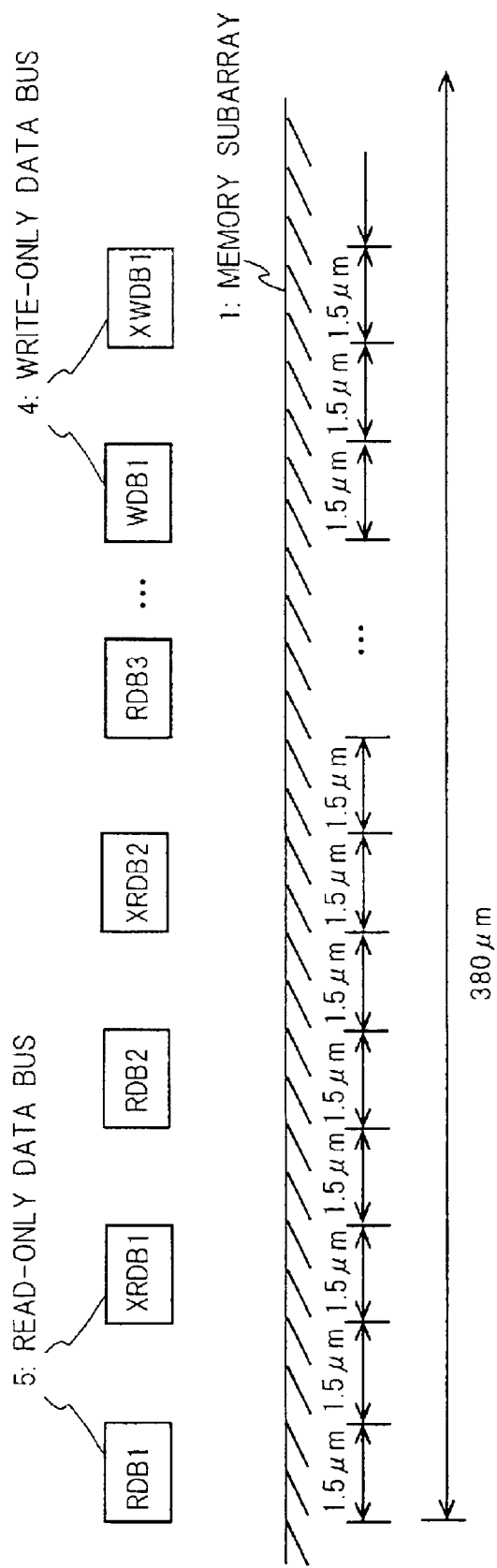
F I G. 13

READ ONLY DATA BUS AND WRITE ONLY DATA BUS FORMING IN DIFFERENT LAYER METALS

BACKGROUND OF THE INVENTION

The present invention relates to a semiconductor memory device for storing desired data therein and performing reading or writing of data therefrom and thereto at high speed.

Among various kinds of semiconductor memory devices, dynamic random access memory (hereinafter referred to as DRAM) has been often used as a mass storage device.

Referring to FIGS. 1, 12 and 13, a DRAM of Conventional Example 1 will be explained.

FIG. 1 shows the structure of the DRAM of Conventional Example 1 in schematic form. (FIG. 1 also applies to Embodiments.)

The DRAM will be described below with reference to FIG. 1.

The DRAM as shown in FIG. 1 has a memory subarray 1, a sense amplifier subarray 2, a peripheral circuit area 3, a write-only data bus 4 and a read-only data bus 5.

In the memory subarray 1, a plurality of DRAM cells is arranged in an array. In the sense amplifier subarray 2, a plurality of sense amplifier for detecting and amplifying a small signal of the memory subarray 1 is arranged in an array. The peripheral circuit area 3 receives or sends data from/to outside. The write-only data bus 4 transfers data from the peripheral circuit area 3 to a memory cell via the sense amplifier. The read-only data bus 5 transfers data in a memory cell amplified by the sense amplifier to the peripheral circuit area 3.

Operations of the conventional DRAM thus constructed will be described below.

In writing data from outside into a memory cell, the data from the peripheral circuit area 3 is written into the sense amplifier subarray 2 through the write-only data bus 4 and then the data in the sense amplifier subarray 2 is written into a designated memory cell through a bit line.

In reading data to outside, data in a memory cell is amplified by the sense amplifier subarray 2 via a bit line and then the amplified data is transferred to the peripheral circuit area 3 through the read-only data bus 5 to read out.

FIG. 12 is a schematic view illustrating data buses formed on the memory subarray of the semiconductor memory device according to Conventional Example 1 (when viewed from a top surface of the semiconductor memory device). In FIG. 12, reference numerals 1, 4 and 5 designate the memory subarray, the write-only data bus and the read-only data bus, respectively. The functions of these elements are mentioned above.

FIG. 13 is a schematic sectional view illustrating wiring of data buses of the semiconductor memory device according to Conventional Example 1 (a sectional view taken along the face perpendicular to each data bus line on the memory array (the face V—V of FIG. 12)).

In the present specification (including each Conventional Example and Embodiment), RDB1, XRDB1, RDB2, XRDB2, RDB3 and so forth are read lines, and WDB1, XWDB1, WDB2, XWDB2 and so forth are write lines.

In the respective pairs of lines, RDB1 and XRDB1, RDB2 and XRDB2 and so forth, each pair transmits complementary signals which are 1-bit of read signal.

In the respective pairs of lines, WDB1 and XWDB1, WDB2 and XWDB2 and so forth, each pair transmits complementary signals which are 1-bit of write signal.

In FIG. 13, the read-only data bus and the write-only data bus are formed in a same metal layer and two lines of each pair are arranged adjacently to each other.

In FIG. 13, each line extends in the direction perpendicular to the sheet.

In this specification, the read line and write line in each Conventional Example and Embodiment are 1.5 μm in thickness (width) and located at minimum 1.5 μm intervals.

The write-only data bus and the read-only data bus are a 32 bits of complementary data bus and all lines are aligned within the bus width of 380 μm.

The read-only data bus has 64 (32 pairs) read lines and the write-only data bus has 64 (32 pairs) write lines.

This allows stray capacitance between lines of each Conventional Example and Embodiment to be compared in the same conditions. The bus width of 380 μm is calculated from the following equation:

$$1.5 \mu m \times \{(64+64)+127\} \approx 380 \mu m$$

That is, 380 μm is the narrowest bus width within which data buses are positioned in Conventional Examples 1 and 2.

While the demand for advanced micro-fabrication technique and high-performance semiconductor memory device grows, there has been a problem that performance of semiconductor memory device cannot be improved due to delay in working speed of data bus caused by increase in interference noise (including Miller noise) between read lines or write lines. The interference noise is generated by increase in wiring capacitance as well as coupling capacitance between lines.

As a conventional example, a semiconductor memory device having the structure that a write line and a read line are positioned alternately in a same layer is disclosed in patent publication for U.S. Pat. No. 2,508,245 (hereinafter referred to as Conventional Example 2). In this structure, in consideration that read data bus and write data bus do not operate concurrently, read lines and write lines are placed alternately, thereby to decrease interference noise such as Miller noise(caused by Miller capacitance)between read lines or write lines. This can achieve the semiconductor memory device with high-speed operating data bus.

With reference to FIGS. 1, 14 and 15, the DRAM of Conventional Example 2 will be described.

The semiconductor memory device of Conventional Example 2 has the same structure as that shown in FIG. 1. FIG. 1 has been already described above.

FIG. 14 is a schematic view illustrating data buses formed on the memory subarray of the semiconductor memory device according to Conventional Example 2 (when viewed from a top surface of the semiconductor memory device). In FIG. 14, reference numerals 1, 4 and 5 designate a memory subarray, a write-only data bus and a read-only data bus, respectively. The structure of these elements was explained referring to FIG. 1

FIG. 15 is a schematic sectional view illustrating wiring of data buses of the semiconductor memory device according to Conventional Example 2 (a sectional view taken along the face perpendicular to each line of data buses on the memory array (the face VI—VI of FIG. 14)).

As read lines RDB and XRDB and write lines WDB and XWDB are described referring to FIG. 13, their explanation will be omitted.

In FIG. 15, the read lines and the write lines are positioned alternately in a same metal layer. As shown in FIG. 15, in aligning data bus lines within the bus width of 380 μm, an interval between a pair of lines (for example, RDB1 and XRDB1) becomes 4.5 μm.

The stray capacitance between two lines in a pair depends on interval between the two lines except for a conductive part (width of a line intervening the two lines in a pair). Each line of data buses is in a precharged state during non-operating time. Therefore, an adjacent precharged line bus serves as a shield line between a pair of lines, thereby to eliminate any interference between the pair of lines. This can reduce interference noise such as Miller noise between read lines or write lines so that the semiconductor memory device can achieve high-speed operating data bus.

In order to operate the semiconductor memory device at higher speed, however, it is necessary to further reduce coupling capacitance and interference noise between read lines or write lines.

An objection of the present invention is to provide a semiconductor memory device that enables data buses to operate at high speed by reducing interference noise (including Miller noise) between data bus lines.

In semiconductor memories such as dual port RAM, write operation and read operation mix and a write-only data bus and a read-only data bus transmit a signal concurrently. In such semiconductor memories, interference noise between a write line and a read line also causes a problem. Another object of the present invention is to provide a semiconductor memory device such as dual port RAM which enables data buses to operate at high speed by reducing interference noise between a write line and a read line.

Further, given that write-only data bus becomes precharged at ground level and the write-only data bus is situated next to a VDD (power source) line, when dust generated during manufacturing process causes short-circuit between the write-only data bus and the VDD line, penetrating current between the GND (ground) line and the shorted VDD line occurs through the write-only data bus in precharged state, resulting in faulty penetrating current during standby.

In order to solve the above-mentioned problem, in the present invention, for instance, a read-only data bus and a VDD line are formed in one layer, a write-only data bus and a GND (VSS) line are formed in another layer, the read-only data bus become precharged at VDD level and the write-only data bus become precharged at GND level. This structure intends to provide a semiconductor memory device that causes no standby current failure even when short-circuit between adjacent lines occurs.

BRIEF SUMMARY OF THE INVENTION

The present invention solves the above-described problem by means of the below-described configurations.

A semiconductor memory device according to an aspect of the present invention comprises a read-only data bus being formed in a first metal layer and having plural pairs of read lines precharged to an arbitrary voltage, two lines in a pair transmitting complementary read signals; and a write-only data bus being positioned in parallel with said read-only data bus, being formed in a second metal layer different from the first metal layer and having plural pairs of write lines precharged to an arbitrary voltage, two lines in a pair transmitting complementary write signals.

In the above-described semiconductor memory device according to another aspect of the present invention, the read-only data bus is formed on a memory array and transfers data amplified by a sense amplifier in a memory cell to peripheral circuit area; and the write-only data bus is formed on the memory array and transfers data from the peripheral circuit area to a memory cell.

In the above-described semiconductor memory device according to another aspect of the present invention, each two lines in a pair are positioned adjacent to each other and each line of the read-only data bus and each line of write-only data bus are arranged so as to substantially overlap one another in vertical direction.

In the above-described semiconductor memory device according to another aspect of the present invention, each two lines in a pair are positioned adjacent to each other and each line of the read-only data bus is arranged so as intervene between adjoining lines of the write-only data bus.

In the above-described semiconductor memory device according to another aspect of the present invention, two lines in a pair in the read-only data bus or the write-only data bus are positioned adjacent to each other, and interval between the two lines in a pair is narrower than interval between each two lines not in a pair.

In the above-described semiconductor memory device according to another aspect of the present invention, any ones of power source lines and ground lines are formed in a first metal layer and each line of them is arranged so as to intervene two lines not in a pair of the read-only data bus; and the other ones of power source lines and ground lines are formed in a second metal layer and each line of them is arranged so as to intervene two lines not in a pair of the write-only data bus.

In the above-described semiconductor memory device according to another aspect of the present invention, the read-only data bus is precharged to a same electrical potential as any ones of power source lines and ground lines formed in the first metal layer; and the write-only data bus is precharged to a same electrical potential as the other ones of power source lines and ground lines formed in the second metal layer.

A semiconductor memory device according to another aspect of the present invention, comprises a read-only data bus having plural pairs consisting of a first line and a second line precharged to an arbitrary voltage, two lines in a pair transmitting complementary read signals; and a write-only data bus being positioned in parallel with the read-only data bus and having plural pairs consisting of a third line and a fourth line precharged to an arbitrary voltage, two lines in a pair transmitting complementary write signals, wherein the first line and the third line are formed in a first metal layer, and the second line and the fourth line are formed in a second metal layer different from the first metal layer.

In the above-described semiconductor memory device according to another aspect of the present invention, the read-only data bus is formed on a memory array and transfers data amplified by a sense amplifier in a memory cell to peripheral circuit area; and the write-only data bus is formed on the memory array and transfers data from the peripheral circuit area to a memory cell.

In the above-described semiconductor memory device according to another aspect of the present invention, the first line and the third line are positioned alternately; the second line and the fourth line are positioned alternately; the second line in pair with the first line is arranged in substantially overlapping relation with the third line adjacent to the first line; and the fourth line in pair with the third line is arranged in substantially overlapping relation with the first line adjacent to the third line.

In the above-described semiconductor memory device according to another aspect of the present invention, interval between two lines in a pair of the read-only data bus is narrower than interval between two adjoining lines not in a pair of the read-only data bus, or interval between two lines in a pair of the write-only data bus is narrower than interval between two adjoining lines not in a pair of the write-only data bus.

The novel features of the invention are set forth with particularity in the appended claims. The invention as to both structure and content, and other objects and features thereof will best be understood from the detailed description when considered in connection with the accompanying drawings.

BRIEF DESCRIPTION OF THE DRAWINGS

FIG. 4 is a view illustrating the structure of data buses of a DRAM according to Embodiment 2.

FIG. 13 is a sectional view of data buses of the DRAM according to Conventional Example 1.

Part or All of the drawings are drawn schematically for diagrammatic representation and it should be considered that they do not necessarily reflect relative size and position of components shown therein.

DETAILED DESCRIPTION

Embodiments 1 to 5 as preferred embodiments of a semiconductor memory device according to the present invention will be described below.
Embodiment 1

Figure 1:
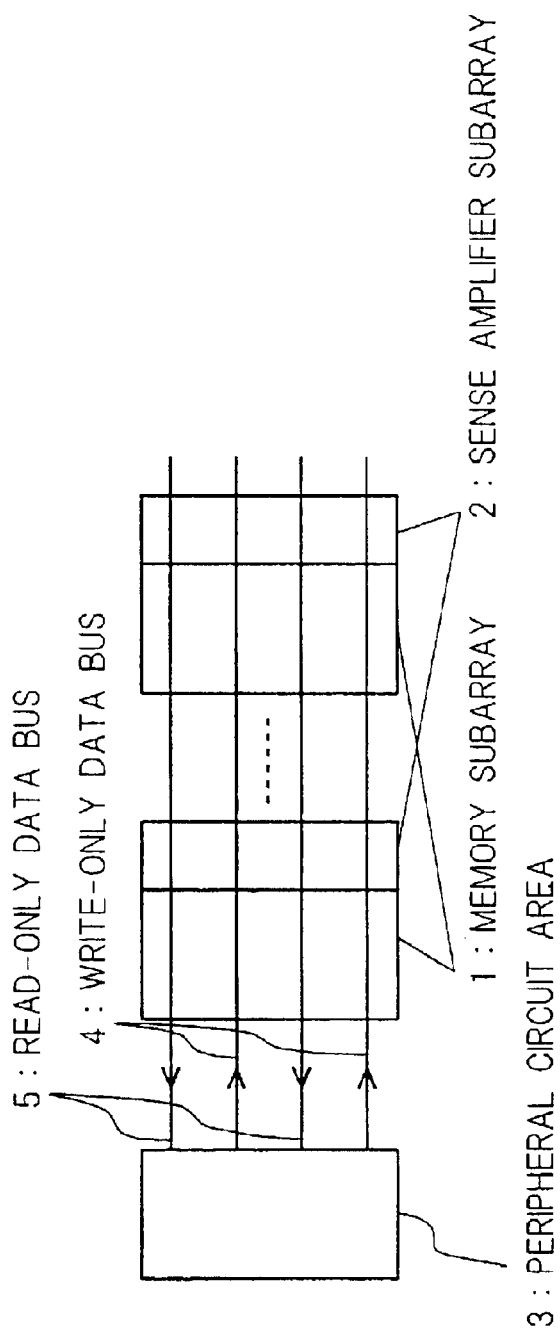
FIG. 1 is a view illustrating the structure of a DRAM.
Figure 2:
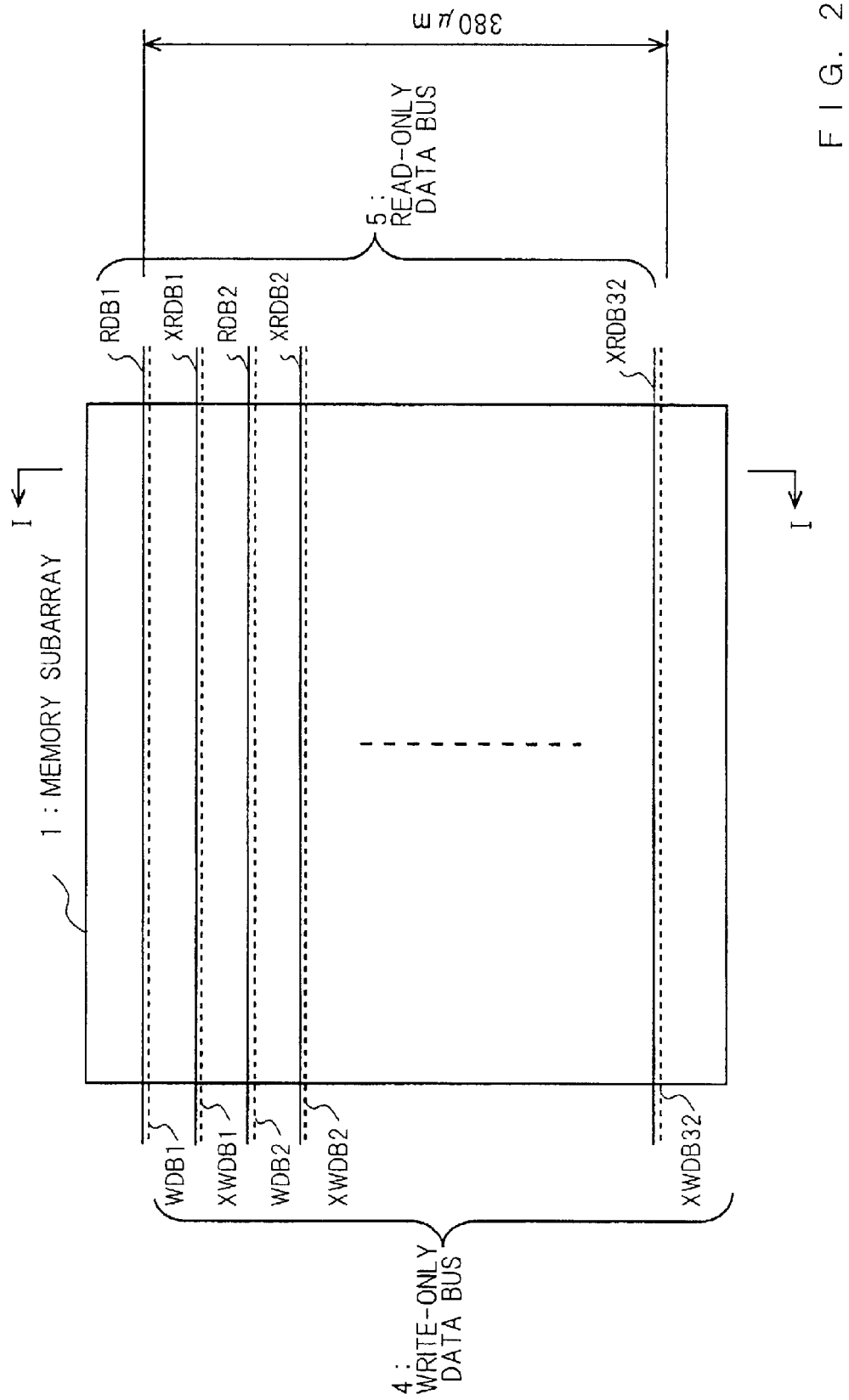
FIG. 2 is a view illustrating the structure of data buses of a DRAM according to Embodiments 1 and 3.
Figure 3:
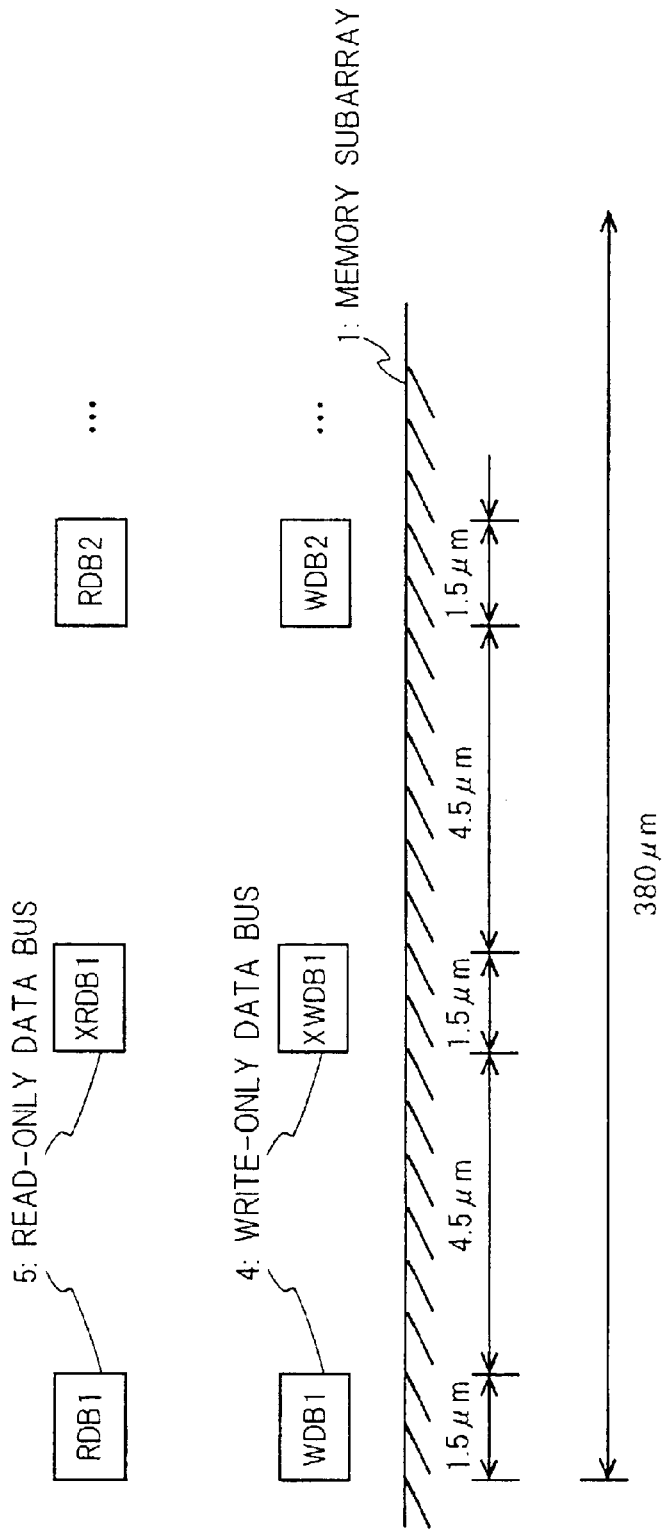
FIG. 3 is a sectional view of data buses of the DRAM according to Embodiment 1.

Referring to FIGS. 1, 2 and 3, a semiconductor memory device (DRAM) of Embodiment 1 will be described below.

The semiconductor memory device of Embodiment 1 has the structure as shown in FIG. 1. FIG. 1 has been already described above.

FIG. 2 is a schematic view illustrating data buses formed on a memory subarray of the semiconductor memory device according to Embodiment 1 (when viewed from a top surface of the semiconductor memory device). In FIG. 2, reference numerals 1, 4 and 5 designate a memory subarray, a write-only data bus and a read-only data bus, respectively. The functions of these elements have already mentioned referring to FIG. 1. However, each write line of the write-only data bus and each read line of the read-only data bus are arranged so as to vertically overlap one another as shown in FIG. 3.

FIG. 3 is a schematic sectional view illustrating wiring of data buses of the semiconductor memory device according to Embodiment 1 (a sectional view taken along the face perpendicular to each data bus line on the memory array (the face I—I of FIG. 2)). In FIG. 3, each line extends in the direction perpendicular to the sheet.

The write-only data bus having plural pairs of write lines, each two lines in a pair being positioned adjacent to each other (WDBi and XWDBi ($1 \leq i \leq 32$)), is formed in a first metal layer, while the read-only data bus having plural pairs of read lines, each two lines in a pair being positioned adjacent to each other (RDBi and XRDBi ($1 \leq i \leq 32$)), is formed in a second metal layer.

The write-only data bus becomes precharged to ground voltage and transmits a write signal in writing data. The read-only data bus becomes precharged to power source voltage and transmits a read signal in reading data.

The read-only data bus is arranged in parallel with the write-only data bus, and each read line and each write line are arranged so as to substantially overlap each other.

In the semiconductor memory device of Embodiment 1, the read-only data bus and the write-only data bus are formed in different metal layers. Accordingly, when all data bus lines are positioned within a bus width of 380 $\mu$m as shown in FIG. 3, interval between adjacent read lines of read-only data bus and interval between adjacent write lines of write-only data bus become 4.5 $\mu$m, respectively.

Figure 15:
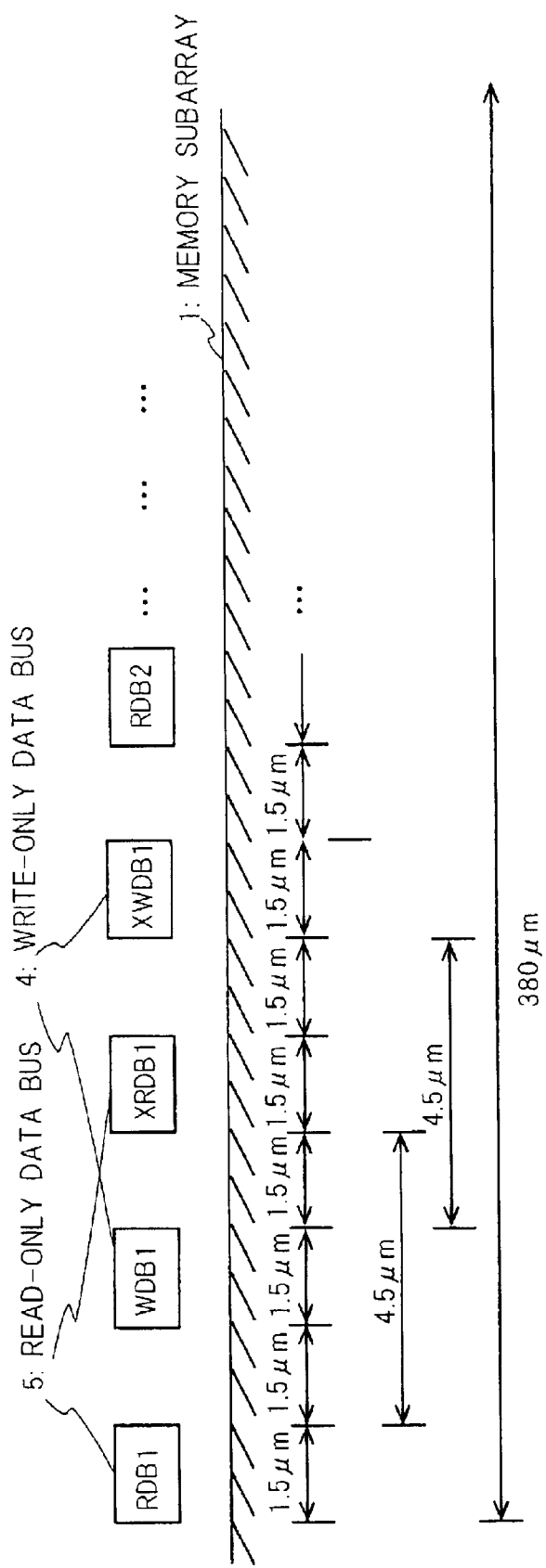
FIG. 15 is a sectional view of data buses of the DRAM according to Conventional Example 2.

As the interval of 4.5 $\mu$m excludes a conductive part, an effective interval which decides stray capacitance between lines also becomes 4.5 $\mu$m. The effective interval is three times as the interval of 1.5 $\mu$m of Conventional Examples 1 (FIG. 13) and 2 (FIG. 15). Assuming that adjoining lines are similar to parallel plates, since stray capacitance between lines is inverse proportion to interval between lines, coupling capacitance as well as interference noise between adjacent lines which caused in the semiconductor memory device of Embodiment 1 are reduced to one-third of those in Conventional Examples. This reduces load capacitance and interference noise (including Miller noise) of data buses, thereby to enable the semiconductor memory device of Embodiment 1 to operate at higher speed.
Embodiment 2

Figure 5:
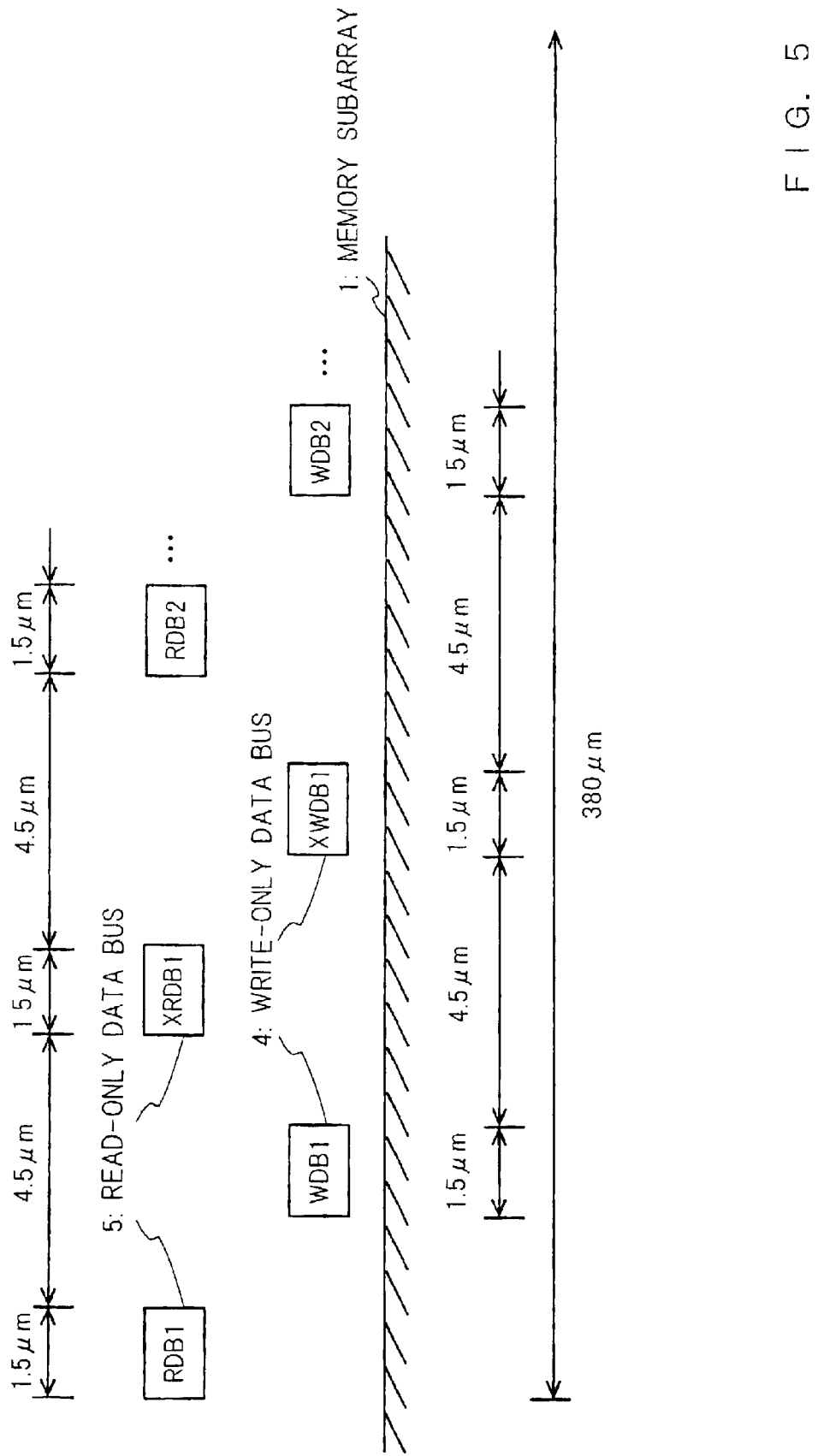
FIG. 5 is a sectional view of data buses of the DRAM according to Embodiment 2.

Referring to FIGS. 1, 4 and 5, a semiconductor memory device (DRAM) of Embodiment 2 will be described below.

The semiconductor memory device of Embodiment 2 has the structure as shown in FIG. 1. FIG. 1 has been already described above.

FIG. 4 is a schematic view illustrating data buses formed on a memory subarray of the semiconductor memory device according to Embodiment 2 (when viewed from a top surface of the semiconductor memory device). In FIG. 4, reference numerals 1, 4 and 5 designate a memory subarray, a write-only data bus and a read-only data bus, respectively. The functions of these elements have already mentioned referring to FIG. 1.

FIG. 5 is a schematic sectional view illustrating wiring of data buses of the semiconductor memory device according to Embodiment 2 (a sectional view taken along the face perpendicular to each data bus line on the memory array (the face II—II of FIG. 4)). In FIG. 5, each line extends in the direction perpendicular to the sheet.

The write-only data bus having plural pairs of write lines, two lines in a pair being positioned adjacent to each other (WDBi and XWDBi ($1 \leq i \leq 32$)), is formed in a first metal layer, while the read-only data bus having plural pairs of read lines, two lines in a pair being positioned adjacent to each other (RDBi and XRDBi ($1 \leq i \leq 32$)), is formed in a second metal layer.

The write-only data bus becomes precharged to ground voltage and transmits a write signal in writing data. The read-only data bus becomes precharged to power source voltage and transmits a read signal in reading data.

The read-only data bus is arranged in parallel with the write-only data bus, and a read line is arranged so as to intervene between write lines as shown in FIG. 5.

In the semiconductor memory device of Embodiment 2 as in Embodiment 1, the read-only data bus and the write-only data bus are formed in different metal layers. Accordingly, when all lines are positioned within a bus width of 380 μm as shown in FIG. 5, interval between adjacent read lines of read-only data bus and interval between adjacent write lines of write-only data bus become 4.5 μm, respectively. As the interval of 4.5 μm excludes a conductive part, an effective interval which decides stray capacitance between lines also becomes 4.5 μm. This reduces coupling capacitance and load capacitance as well as interference noise (including Miller noise) between adjacent lines. Further, by positioning each write line as to intervene between read lines in vertical direction, interval between a write line and a read line of Embodiment 2 becomes larger than interval of Conventional Example 1, Conventional Example 2 and Embodiment 1, causing reduction in coupling capacitance between a write line and a read line. As a result, the semiconductor memory device of Embodiment 2 can operate at high speed. It is suitable for a dual port RAM (that transmits signals through write-only data bus and read-only data bus concurrently).

Embodiment 3

Figure 6:
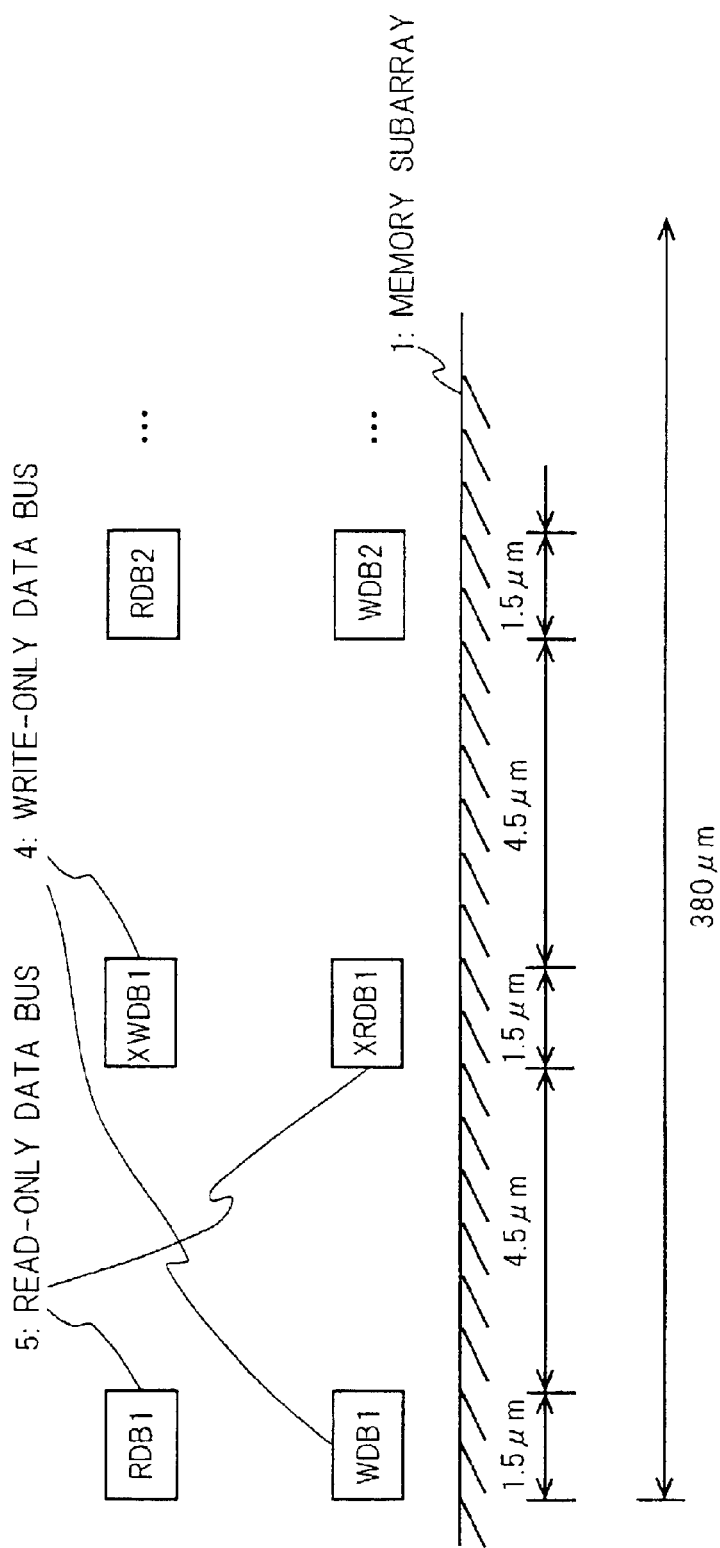
FIG. 6 is a sectional view of data buses of the DRAM according to Embodiment 3.

Referring to FIGS. 1, 2 and 6, a semiconductor memory device (DRAM) of Embodiment 3 will be hereinafter described.

The semiconductor memory device of Embodiment 3 has the structure as shown in FIG. 1. FIG. 1 has been already described above.

FIG. 2 is a schematic view illustrating data buses formed on a memory subarray of the semiconductor memory device according to Embodiment 3 (when viewed from a top surface of the semiconductor memory device). FIG. 2 has already been explained in Embodiment 2. However, as understood from comparison of FIG. 3 to FIG. 6, one of read lines in pair of the read-only data bus (XRDB 1 to 32 in FIG. 6) and one of write lines in pair of the write-only data bus (XWDB 1 to 32 in FIG. 6) are positioned-so as to replace with each other in vertical direction.

FIG. 6 is a schematic sectional view illustrating wiring of data buses of the semiconductor memory device according to Embodiment 3 (a sectional view taken along the face perpendicular to each data bus line on the memory array (the face I—I of FIG. 2)). In FIG. 6, each line extends in the direction perpendicular to the sheet.

Given that two lines in a pair of the read-only data bus consist of a first line (ex. XRDB 1 to 32) and a second line (ex. RDB 1 to 32) and two lines in a pair of the write-only data bus consist of a third line (ex. WDB 1 to 32) and a fourth line (ex. XWDB 1 to 32), the first line and the third line are formed in a first metal layer and the second line and the fourth line are formed in a second metal layer.

The write-only data bus becomes precharged to ground voltage and transmits a write signal in writing data. The read-only data bus becomes precharged to power source voltage and transmits a read signal in reading data.

With respect to positional relationship of, for example, a pair of read lines RDB1 and XRDB1 reading the first bit of data and a pair of write lines WDB1 and XWDB 1 writing the first bit of data, WDB1 is positioned adjacent to XRDB1 in the first metal layer; and RDB1 is positioned in substantially overlapping relation with WDB1, and XWDB1 is positioned adjacent to RDB1 in substantially overlapping relation with XRDB1 in the second layer. That is, each write line and read line are arranged in a staggered manner.

Interval between adjoining lines in the first metal layer and the second metal layers remains 4.5 μm.

Therefore, interval between adjoining two read lines (pair or non-pair) becomes larger than 4.5 μm (diagonal relationship) and interval between adjoining two write lines (pair or non-pair) also becomes larger than 4.5 μm. This further reduces interference noise (including Miller noise) so that the semiconductor memory device of this Embodiment can operate at higher speed.

Embodiment 4

Figure 7:
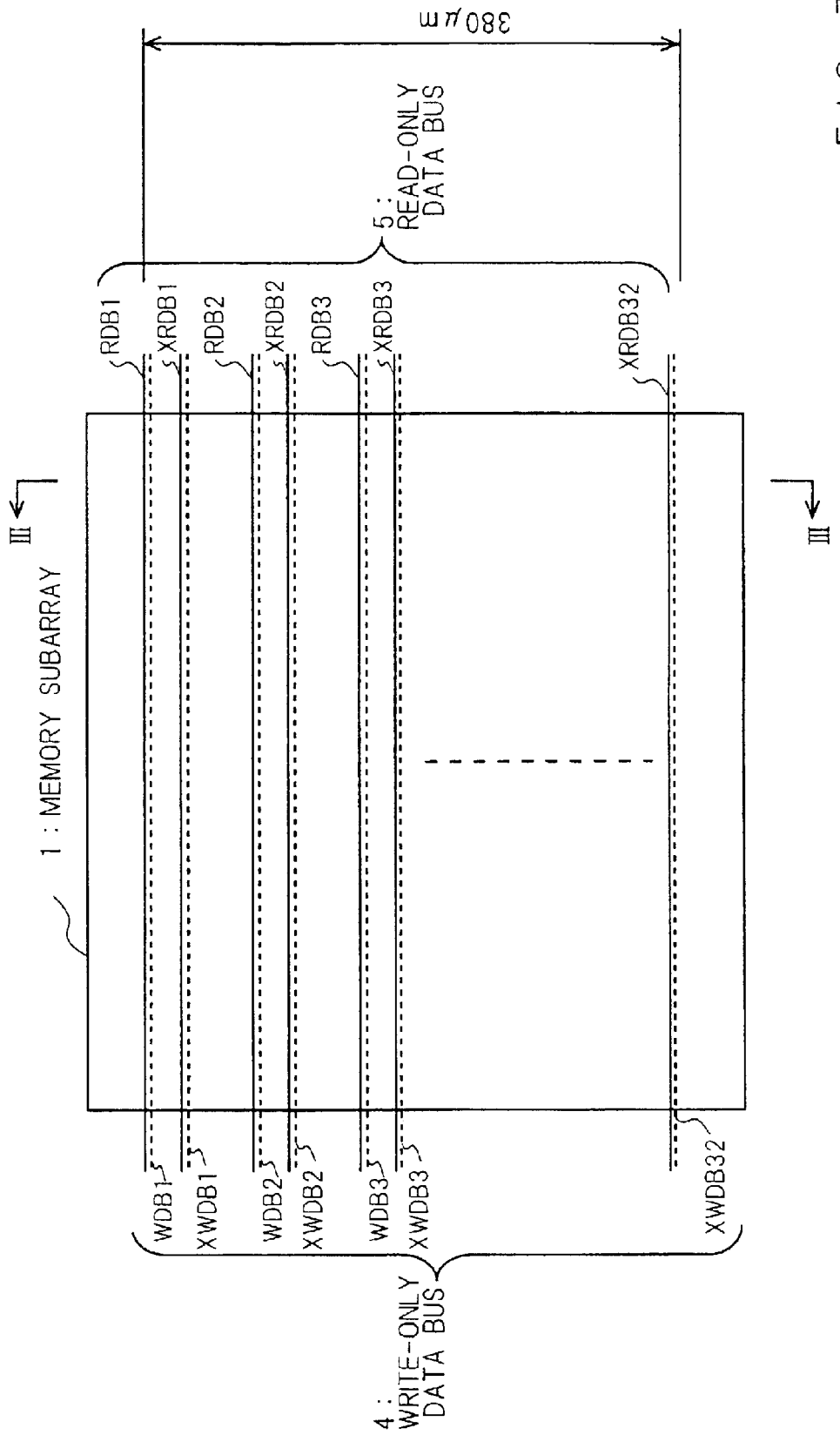
FIG. 7 is a view illustrating the structure of data buses of a DRAM according to Embodiment 4.
Figure 8:
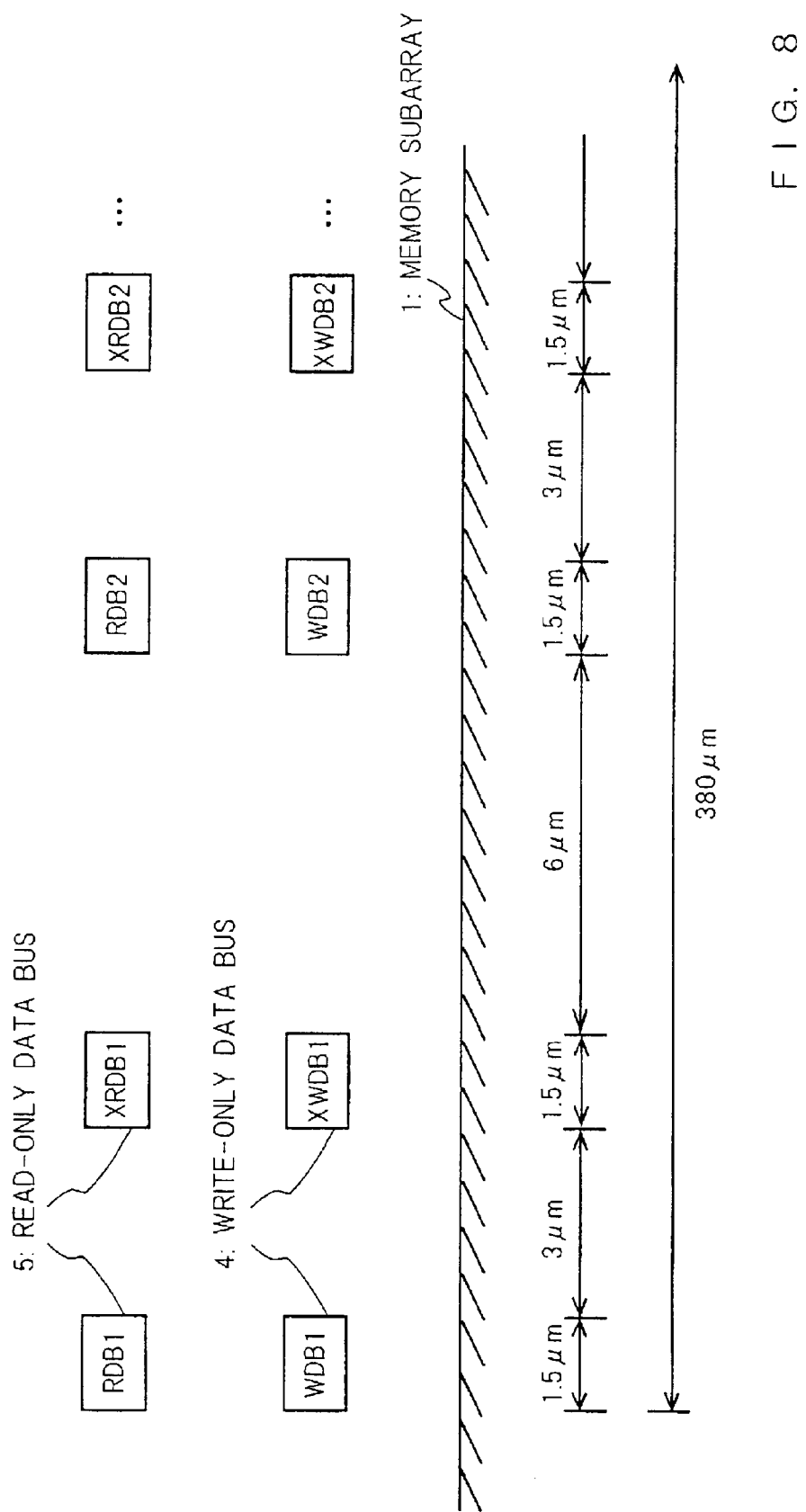
FIG. 8 is a sectional view of data buses of the DRAM according to Embodiment 4.

Referring to FIGS. 1, 7 and 8, a semiconductor memory device (DRAM) of Embodiment 4 will be described below.

The semiconductor memory device of Embodiment 4 has the structure as shown in FIG. 1. FIG. 1 has been already described above.

FIG. 7 is a schematic view illustrating data buses formed on a memory subarray of the semiconductor memory device according to Embodiment 4 (when viewed from a top surface of the semiconductor memory device). In FIG. 7, reference numerals 1, 4 and 5 designate a memory subarray, a write-only data bus and a read-only data bus, respectively. The functions of these elements are identical to those in Conventional Examples.

FIG. 8 is a schematic sectional view illustrating wiring of data buses of the semiconductor memory device according to Embodiment 4 (a sectional view taken along the face perpendicular to each data bus line on the memory array (the face III—III of FIG. 7)). In FIG. 8, each line extends in the direction perpendicular to the sheet.

The write-only data bus having plural pairs of write lines, each two lines in a pair being positioned adjacent to each other (WDBi and XWDBi ($1 \leq i \leq 32$)), is formed in a first metal layer, while the read-only data bus having plural pairs of read lines, each two lines in a pair being positioned adjacent to each other (RDBi and XRDBi ($1 \leq i \leq 32$)), is formed in a second metal layer.

The write-only data bus becomes precharged to ground voltage and transmits a write signal in writing data. The read-only data bus becomes precharged to power source voltage and transmits a read signal in reading data.

The read-only data bus is arranged in parallel with the write-only data bus, and each read line is arranged so as to be positioned in substantially overlapping relation with each write line.

In Embodiment 1, both intervals between two complementary lines in a pair and between two adjoining lines not in a pair are same (4.5 μm).

In Embodiment 4, interval between two complementary lines in a pair (ex. interval between RDB1 and XRDB1) is set slightly narrower (3 μm) and interval between two adjoining lines not in a pair (ex. interval between XRDB1 and RDB2) is set larger. Except for this, the semiconductor memory device of Embodiment 4 is identical to that of Embodiment 1.

In data buses of a semiconductor memory device, a non-pair of lines may cause more harmful interference noise than a pair of lines. In Embodiment 4, interference noise between a non-pair of lines can be further reduced. This allows data buses of a semiconductor memory device to operate at higher speed.

In Embodiment 3 (FIG. 6), both intervals between two complementary lines in a pair and between two adjoining lines not in a pair are same. Teaching of Embodiment 4 can be incorporated into Embodiment 3. For instance, in FIG. 6, by decreasing interval between RDB1 and XWDB1 (interval between WDB1 and XRDB1) to 3 $\mu$m and increasing interval between XWDB1 and RDB2 (interval between XRDB1 and WDB2) to 6 $\mu$m, Embodiment 3 can obtain the similar effect as Embodiment 4.

Embodiment 5

Referring to FIGS. 1, 9, 10 and 11, a semiconductor memory device (DRAM) of Embodiment 5 will be hereinafter described.

The semiconductor memory device of Embodiment 5 has the structure as shown in FIG. 1. FIG. 1 has been already described above.

Figure 9:
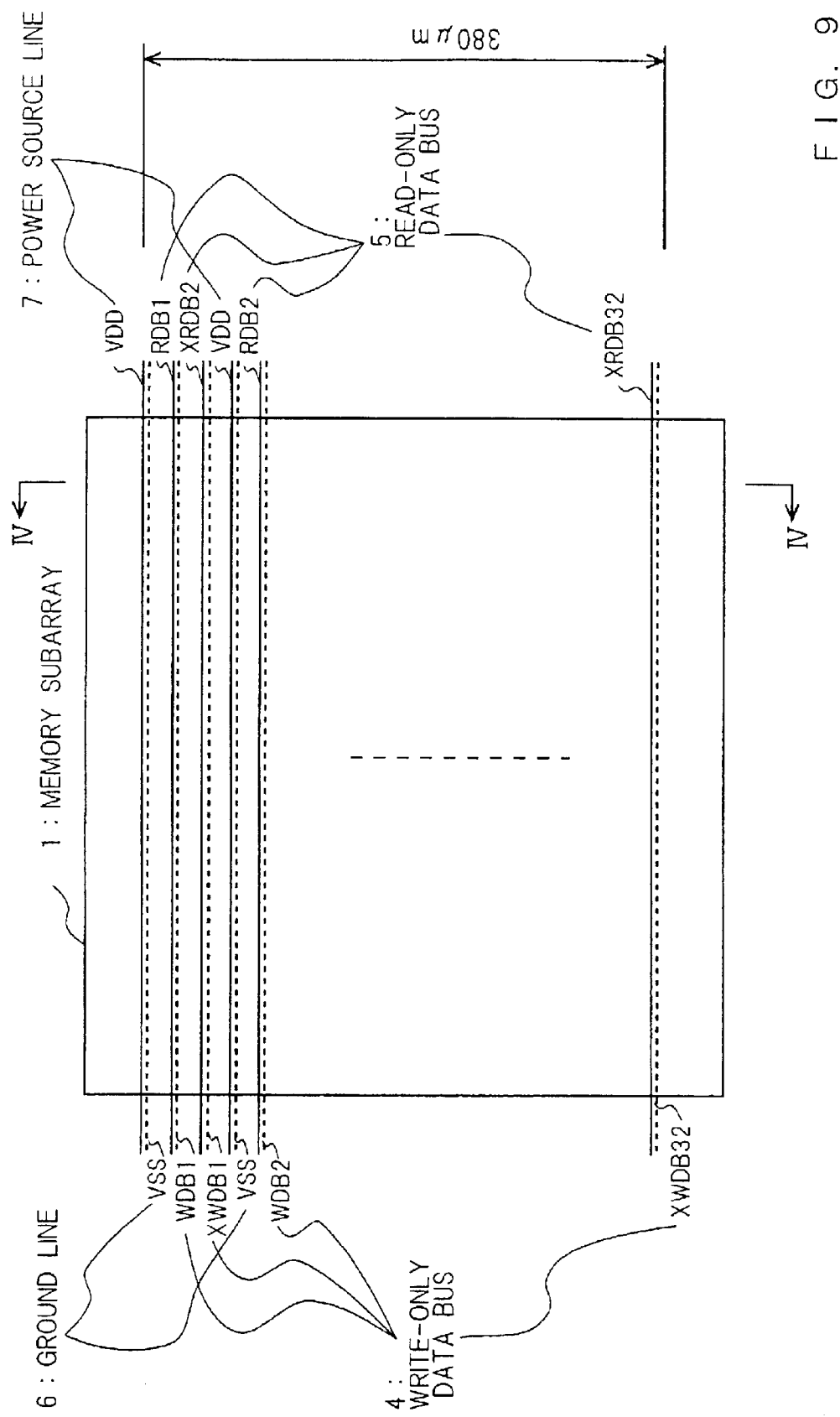
FIG. 9 is a view illustrating the structure of data buses of a DRAM according to Embodiment 5.

FIG. 9 is a schematic view illustrating data buses formed on a memory subarray of the semiconductor memory device according to Embodiment 5 (when viewed from a top surface of the semiconductor memory device).

In FIG. 9, reference numerals 1, 4, 5, 6 and 7 designate a memory subarray, a write-only data bus, a read-only data bus, a ground (VSS) line and a power source (VDD) line, respectively. As the functions of these elements are identical to those in Conventional Examples, their explanation will be omitted.

In the semiconductor memory device of this Embodiment, the write-only data bus and the read-only data bus are formed in different metal layers to constitute multilayer structure. It is characterized in that the VSS lines and the write-only data bus are positioned in one layer and the VDD lines and the read-only data bus are positioned in another layer.

Figure 10:
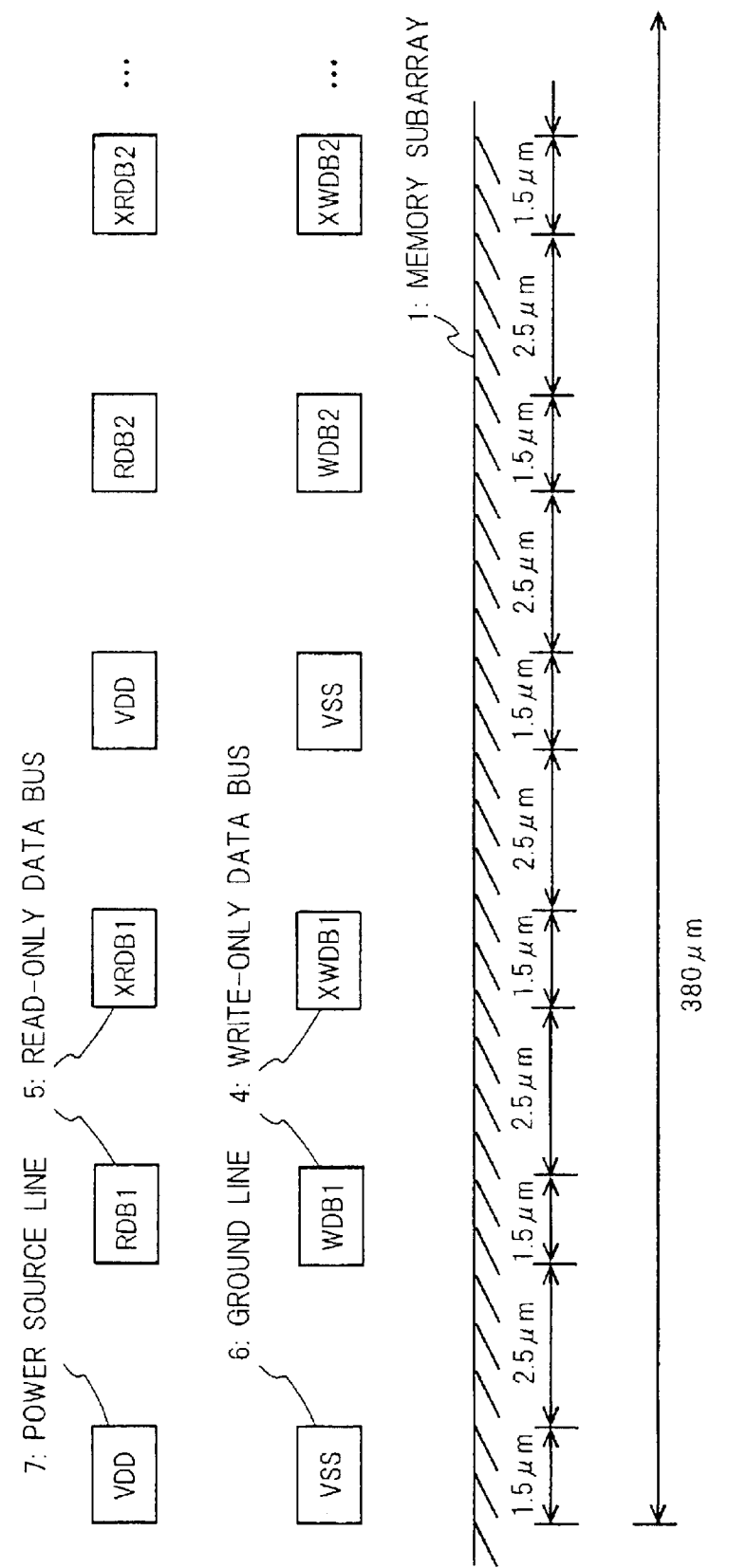
FIG. 10 is a sectional view of data buses of the DRAM according to Embodiment 5.

FIG. 10 is a schematic sectional view illustrating wiring of data buses of the semiconductor memory device according to Embodiment 5 (a sectional view taken along the face perpendicular to each data bus line on the memory array (the face IV—IV of FIG. 9)). In FIG. 10, each line extends in the direction perpendicular to the sheet.

The write-only data bus having plural pairs of write lines, two lines in a pair being positioned adjacent to each other (WDB and XWDB), and the VSS lines are formed in a first metal layer, while the read-only data bus having plural pairs of read lines, two lines in a pair being positioned adjacent to each other (RDB and XRDB), and the power source lines are formed in a second metal layer.

The read-only data bus is arranged in parallel with the write-only data bus, and each read line is positioned in substantially overlapping relation with each write line. Further, the VDD line and the VSS line are arranged so as to substantially overlap each other in vertical direction.

A VSS line is positioned between two write lines not in a pair in the first metal layer, while a VDD line is positioned between two read lines not in a pair in the second metal layer.

Both in the first metal layer and the second metal layer, interval between adjoining lines is fixed at 2.5 $\mu$m and the data bus width is 380 $\mu$m as shown in FIG. 10.

Figure 11:
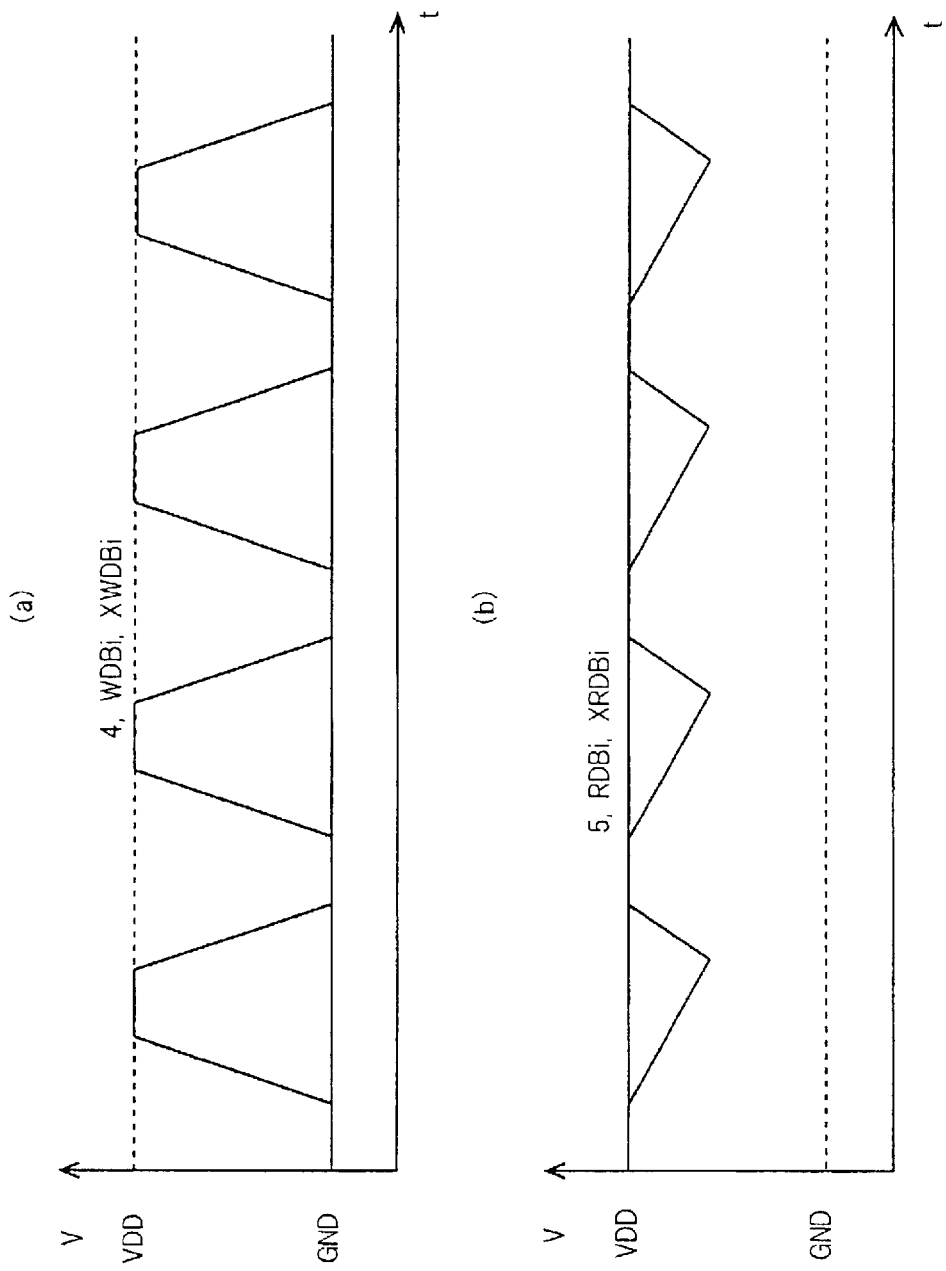
FIG. 11 is a waveform diagram at the operating time of data buses.
Figure 12:
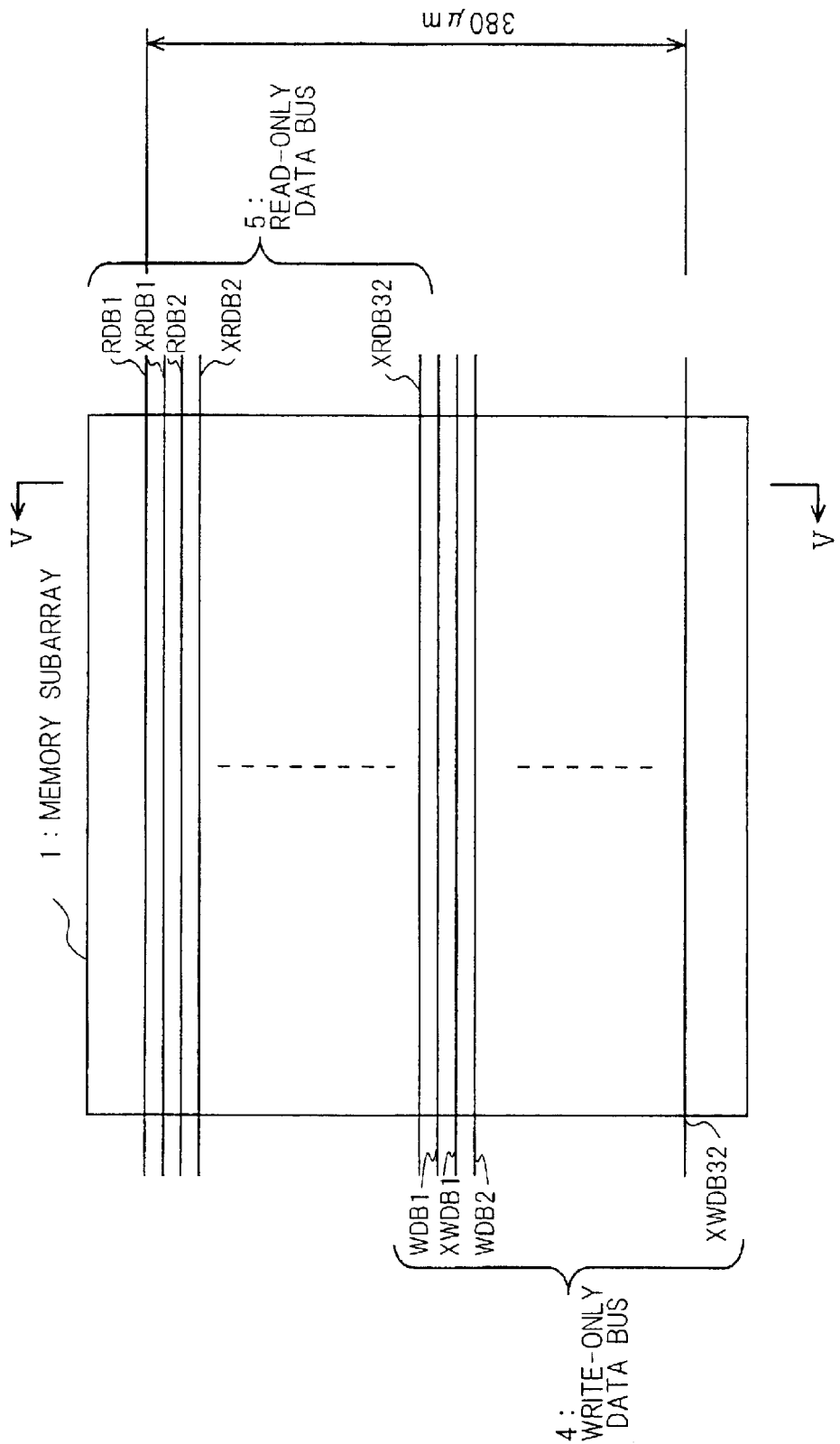
FIG. 12 is a view illustrating the structure of data buses of a DRAM according to Conventional Example 1.
Figure 14:
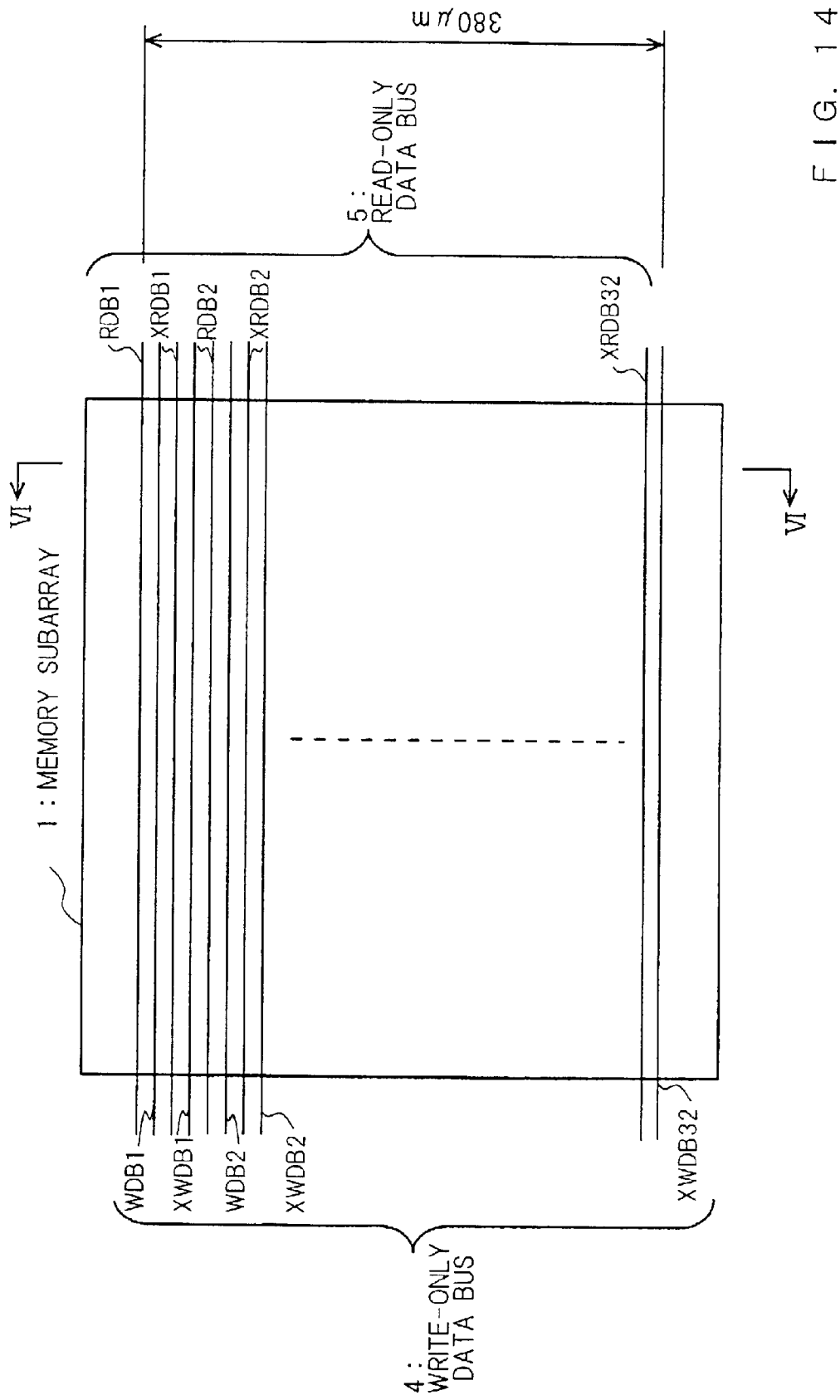
FIG. 14 is a view illustrating the structure of data buses of a DRAM according to Conventional Example 2.

Part (a) of FIG. 11 is a waveform diagram at the operating time of write data bus and part (b) of FIG. 11 is a waveform diagram at the operating time of read data bus.

As shown in part (a) of FIG. 11, the write-only data bus that transmits a write signal becomes precharged at GND (ground) level, and one of complementary write lines (pair lines) is pulled up to VDD level and the other of them remains at GND level, thereby to transfer data to a sense amplifier.

As shown in part (b) of FIG. 11, the read-only data bus that transmits a read signal becomes precharged at VDD (power source) level, and one of complementary read lines (pair lines) is pulled down to GND (ground) level and the other of them remains at VDD level, thereby to transfer data from a sense amplifier.

With the construction of this Embodiment, a VSS line is positioned between two write lines not in a pair, while a VDD line is positioned between two read lines not in a pair. The VSS line and VDD line has a shield effect of suppressing interference noise between two lines not in a pair, thereby to achieve a high-speed operation of data buses.

In Embodiment 5, the write-only data bus and VSS (GND) lines are formed in one layer and the read-only data bus and VDD lines are formed in another layer. The write-only data bus become precharged at GND level and the read-only data bus become precharged at VDD level. Therefore, even when dust generated during manufacturing process causes short-circuit between lines in a same layer, there occurs no penetrating current between the write line at GND level in precharged state and a VSS line, and there occurs no penetrating current between the read line at VDD level in precharged state and a VDD line. As a result, the semiconductor memory device, in which short-circuit between lines occurs, does not generate faulty current during standby. By replacing the short-circuited data bus and corresponding memory with a spare data bus and a spare memory array provided by redundant circuit technology, the semiconductor memory device with short-circuit between lines can be used as a non-defective chip.

In this way, it is possible to provide a semiconductor memory device that enables data buses to operate at higher speed and improve manufacturing yield rate.

In other Embodiments, the write-only data bus and VDD lines are formed in one layer and the read-only data bus and VSS lines are formed in another layer. The write-only data bus become precharged at VDD level and the read-only data bus become precharged at GND level. This allows other Embodiments to obtain similar effect as in Embodiment 5.

As described above, the semiconductor memory device of the present invention has a structure in which a plurality of metal layer forms data buses in order to broaden interval between data bus lines, thereby to reduce wiring capacitance of data buses as well as interference noise between lines. The present invention can thus obtain an advantageous effect of providing a semiconductor memory device making high-speed operation of data buses possible.

Semiconductor memories such as dual port RAM raise a problem of interference noise between a write-only data bus and a read-only data bus. According to the present invention, by reducing interference noise between a write-only data bus and a read-only data bus, a semiconductor memory device realizing high-speed operation of data buses can be achieved.

In the semiconductor memory device of the present invention, for example, the write-only data bus and VDD lines are formed in a same layer, and the read-only data bus and VSS lines are formed in a same layer, respectively. The write-only data bus become precharged at VDD level and the read-only data bus become precharged at GND level. According to the present invention, it is possible to provide a semiconductor memory device that generates no faulty current during standby even in the case of short-circuit between lines and that can be used as a non-defective chip by redundant circuit technology.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A semiconductor memory device comprising: a read-only data bus being formed in a first metal layer and having plural pairs of read lines precharged to a predetermined voltage, two lines in a pair transmitting complementary read signals; and a write-only data bus being positioned in parallel with said read-only data bus, being formed in a second metal layer different from said first metal layer and having plural pairs of write lines precharged to a predetermined voltage, two lines in a pair transmitting complementary write signals.

2. A semiconductor memory device as claimed in claim 1, wherein said read-only data bus is formed on a memory array and transfers data amplified by a sense amplifier in a memory cell to peripheral circuit area; and said write-only data bus is formed on said memory array and transfers data from said peripheral circuit area to a memory cell.

3. A semiconductor memory device as claimed in claim 1, wherein two lines in a pair are positioned adjacent to each other and each line of said read-only data bus and each line of write-only data bus are arranged so as to substantially overlap one another in vertical direction.

4. A semiconductor memory device as claimed in claim 1, wherein two lines in a pair are positioned adjacent to each other and each line of said read-only data bus is arranged so as intervene between adjoining lines of said write-only data bus.

5. A semiconductor memory device as claimed in claim 1, wherein two lines in a pair in said read-only data bus or said write-only data bus are positioned adjacent to each other, and interval between said two lines in a pair is narrower than interval between each two lines not in a pair.

6. A semiconductor memory device as claimed in claim 1, wherein any ones of power source lines and ground lines are formed in a first metal layer and each line of them is arranged so as to intervene two lines not in a pair of said read-only data bus; and the other ones of power source lines and ground lines are formed in a second metal layer and each line of them is arranged so as to intervene two lines not in a pair of said write-only data bus.

7. A semiconductor memory device as claimed in claim 1, wherein said read-only data bus is precharged to a same electrical potential as any ones of power source lines and ground lines formed in said first metal layer; and said write-only data bus is precharged to a same electrical potential as the other ones of power source lines and ground lines formed in said second metal layer.

8. A semiconductor memory device comprising:

a read-only data bus having plural pairs consisting of a first line and a second line precharged to a predetermined voltage, two lines in a pair transmitting complementary read signals; and a write-only data bus being positioned in parallel with said read-only data bus and having plural pairs consisting of a third line and a fourth line precharged to a predetermined voltage, two lines in a pair transmitting complementary write signals, wherein said first line and said third line are formed in a first metal layer, and said second line and said fourth line are formed in a second metal layer different from said first metal layer.

9. A semiconductor memory device as claimed in claim 8, wherein said read-only data bus is formed on a memory array and transfers data amplified by a sense amplifier in a memory cell to peripheral circuit area; and said write-only data bus is formed on said memory array and transfers data from said peripheral circuit area to a memory cell.

10. A semiconductor memory device as claimed in claim 8, wherein said first line and said third line are positioned alternately; said second line and said fourth line are positioned alternately; said second line in pair with said first line is arranged in substantially overlapping relation with said third line adjacent to said first line; and said fourth line in pair with said third line is arranged in substantially overlapping relation with said first line adjacent to said third line.

11. A semiconductor memory device as claimed in claim 8, wherein interval between two lines in a pair of said read-only data bus is narrower than interval between two adjoining lines not in a pair of said read-only data bus, or interval between two lines in a pair of said write-only data bus is narrower than interval between two adjoining lines not in a pair of said write-only data bus.

* * * * *